United States Patent
Yutou et al.

(10) Patent No.: US 9,460,952 B2
(45) Date of Patent: Oct. 4, 2016

(54) FILM FOR PRESSURE-SENSITIVE ADHESIVE TAPE AND PRESSURE-SENSITIVE ADHESIVE TAPE

(71) Applicant: NITTO DENKO CORPORATION, Ibaraki-shi, Osaka (JP)

(72) Inventors: Takumi Yutou, Ibaraki (JP); Toshitaka Suzuki, Ibaraki (JP); Masato Shirai, Ibaraki (JP); Masahiko Ando, Ibaraki (JP); Yuka Sekiguchi, Ibaraki (JP); Ryoko Asai, Ibaraki (JP); Asuka Endo, Ibaraki (JP); Rie Hayashiuchi, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 14/237,067

(22) PCT Filed: Feb. 8, 2013

(86) PCT No.: PCT/JP2013/053015
§ 371 (c)(1),
(2) Date: Feb. 4, 2014

(87) PCT Pub. No.: WO2013/129080
PCT Pub. Date: Sep. 6, 2013

(65) Prior Publication Data
US 2014/0178620 A1    Jun. 26, 2014

(30) Foreign Application Priority Data
Feb. 28, 2012  (JP) .................................. 2012-041172

(51) Int. Cl.
*C09J 183/04* (2006.01)
*H01L 21/683* (2006.01)
(Continued)

(52) U.S. Cl.
CPC ............ *H01L 21/6836* (2013.01); *B32B 7/12* (2013.01); *B32B 27/08* (2013.01); *B32B 27/20* (2013.01);
(Continued)

(58) Field of Classification Search
CPC ............... C09J 133/08–133/12; C09J 183/04; H01L 21/6836; C08L 83/00–83/16; C08L 33/08–33/12
See application file for complete search history.

(56) References Cited

U.S. PATENT DOCUMENTS 4,935,458 A * 6/1990 Suzuki et al. .................. 524/41
5,154,974 A * 10/1992 Norman et al. .......... 428/355 R
(Continued)

FOREIGN PATENT DOCUMENTS

DE  WO 2011063914 A1 * 6/2011 ............ C09J 7/0235
DE  WO 2012110206 A2 * 8/2012 ............... B32B 7/06
(Continued)

OTHER PUBLICATIONS

Bartholomew, Acrylic Pressure Sensitive Adhesives Exhibiting Enhanced Adhesion to Low Surface Energy Substances, available at http://www.adhesivesmag.com/articles/90226-acrylic-pressure-sensitive-adhesives (Sep. 1, 2011).*
(Continued)

*Primary Examiner* — Scott R Walshon
(74) *Attorney, Agent, or Firm* — Sughrue Mion, PLLC (57) ABSTRACT

A film for a pressure-sensitive adhesive tape is a film for a pressure-sensitive adhesive tape, including a non-pressure-sensitive adhesive layer on one surface of a plastic film, where the non-pressure-sensitive adhesive layer includes a mixed layer of a silicone and a (meth)acrylic polymer; and the (meth)acrylic polymer has a calculated Tg of 10° C. or more.

13 Claims, 3 Drawing Sheets (51) Int. Cl.
*C09J 133/12* (2006.01)
*C09J 7/02* (2006.01)
*B32B 7/12* (2006.01)
*B32B 27/08* (2006.01)
*B32B 27/20* (2006.01)
*B32B 27/22* (2006.01)
*B32B 27/28* (2006.01)
*B32B 27/30* (2006.01)

(52) U.S. Cl.
CPC .......... *B32B 27/22* (2013.01); *B32B 27/283* (2013.01); *B32B 27/304* (2013.01); *B32B 27/308* (2013.01); *C09J 7/025* (2013.01); *C09J 133/12* (2013.01); *C09J 183/04* (2013.01); *B32B 2250/24* (2013.01); *B32B 2307/306* (2013.01); *B32B 2405/00* (2013.01); *C09J 2201/606* (2013.01); *C09J 2203/326* (2013.01); *C09J 2427/006* (2013.01); *C09J 2433/00* (2013.01); *C09J 2433/005* (2013.01); *C09J 2483/005* (2013.01); *H01L 2221/68327* (2013.01); *H01L 2221/68336* (2013.01); *Y10T 428/1457* (2015.01); *Y10T 428/24355* (2015.01); *Y10T 428/265* (2015.01); *Y10T 428/266* (2015.01); *Y10T 428/2848* (2015.01); *Y10T 428/2891* (2015.01)

(56) References Cited

U.S. PATENT DOCUMENTS

| | | | | |
|---|---|---|---|---|
| 6,159,595 | A * | 12/2000 | Sumi | 428/336 |
| 6,541,109 | B1 * | 4/2003 | Kumar | C09J 7/0228 106/287.11 |
| 6,828,018 | B2 * | 12/2004 | Waterbury | C09J 7/0207 428/352 |
| 7,419,708 | B2 * | 9/2008 | Kobayashi et al. | 428/32.51 |
| 8,138,580 | B2 * | 3/2012 | Konishi et al. | 257/642 |
| 8,651,919 | B2 * | 2/2014 | Kutsumi et al. | 451/41 |
| 2005/0003216 | A1 * | 1/2005 | Frances | B29C 33/64 428/447 |
| 2010/0193961 | A1 * | 8/2010 | Konishi et al. | 257/773 |
| 2011/0059682 | A1 | 3/2011 | Kutsumi et al. | |
| 2012/0258272 | A1 * | 10/2012 | Engelhard | C09J 7/0235 428/40.2 |
| 2013/0316113 | A1 * | 11/2013 | Engelhard | B32B 7/06 428/40.3 |

FOREIGN PATENT DOCUMENTS

| | | |
|---|---|---|
| EP | 0 919 364 A1 | 6/1999 |
| JP | 8-197688 A | 8/1996 |
| JP | 11-228924 A | 8/1999 |
| JP | 2004-210823 A | 7/2004 |
| JP | 2008-31196 A | 2/2008 |
| JP | 2009-239124 A | 10/2009 |
| JP | 2009-256609 A | 11/2009 |
| JP | 2010-201836 A | 9/2010 |
| JP | 2011-206996 A | 10/2011 |
| JP | 2012015236 A * | 1/2012 |
| JP | 2012-245746 A | 12/2012 |
| JP | 2013-99926 A | 5/2013 |
| JP | 2013-100455 A | 5/2013 |
| JP | 2013-177488 A | 9/2013 |
| JP | 2013-179120 A | 9/2013 |
| TW | 200844476 A | 11/2008 |
| WO | 2009/028068 A1 | 3/2009 |

OTHER PUBLICATIONS

Sigma-Aldrich "Polymer Properties: Thermal Transitions of Homopolymers", available at http://www.sigmaaldrich.com/img/assets/3900/Thermal_Transitions_of_Homopolymers (accessed May 2014).*
Japanese Office Action for JP 2012-041172 dated Oct. 23, 2013.
International Search Report for PCT/JP2013/053015 dated Mar. 5, 2013.
Hans-Georg Elias Ed—Hans-Georg Elias: "Makromolekule, Grundlagen: Struktur, Synthese, Eigenschaften, Thermische Umwandlungen Und Relaxiationen", Jan. 1, 1990, Makromolekule, Grundlagen: Struktur, Synthese, Eigenschaften, Hüthig & Wepf Verlag, Basel Heidelberg New York, 30 Total Pages, XP002594550.
Extended European Search Report dated Nov. 6, 2014, issued by the European Patent Office in counterpart European application No. 13754774.1.
Communication dated Aug. 17, 2015 from the European Patent Office in counterpart application No. 13754774.1.
Rodney J. Andrews et al: "Glass Transition Temperatures of Polymers" In: "Polymer Handbook (4th Edition)", Jan. 1, 1999, John Wiley & Sons, XP055207302, ISBN: 978-0-47-116628-3, vol. 7, pp. VI-193-VI-219.
Communication dated Feb. 2, 2016 from the European Patent Office issued in corresponding Application No. 13754774.1.
Erich Penzel et al., "Some properties of copolymers of vinylidene chloride with acrylates and methacrylates, Part 1", Die Angewandte Makromolekulare Chemie, Applied Macromolecularchemistry and Physics, Wiley-VCH, Weinheim, DE, vol. 273, No. 4703, Jan. 1, 1999, pp. 15-27, XP002594551, ISSN: 0003-3146.
"Katalog Handbuch Feinchemikalien, product No. 18, 206-0", Jan. 1, 1999, Katalog Handbuch Feinchemikalien, Aldrich, p. 1588, XP002594552, 2 pages total.
Office Action dated Jun. 7, 2016, from the Intellectual Property Office of Taiwan in counterpart application No. 102106581.

* cited by examiner

FILM FOR PRESSURE-SENSITIVE ADHESIVE TAPE AND PRESSURE-SENSITIVE ADHESIVE TAPE

CROSS REFERENCE TO RELATED APPLICATIONS

This application is a National Stage of International Application No. PCT/JP2013/053015 filed Feb. 8, 2013, claiming priority based on Japanese Patent Application No. 2012-041172 filed Feb. 28, 2012, the contents of all of which are incorporated herein by reference in their entirety.

TECHNICAL FIELD

The present invention relates to a film for a pressure-sensitive adhesive tape and a pressure-sensitive adhesive tape.

BACKGROUND ART

The surface of a pressure-sensitive adhesive tape to be used in the dicing of a semiconductor opposite to its surface closely adhering to a wafer needs to be fixed to a base for fixing the wafer at the time of the dicing. In general, such fixation is performed with the negative pressure of vacuum adsorption or the like.

When such fixation with the negative pressure is performed, the pressure-sensitive adhesive tape may closely adhere to the base in an excessive manner owing to a state where the negative pressure is excessively applied or to the melting of the pressure-sensitive adhesive tape caused by heat generation at the time of the dicing. When such excessive close adhesion occurs, handleability upon release of the fixation to the base deteriorates, and for example, the following problem arises. A semiconductor production process including the dicing does not proceed smoothly.

The following technology has been reported for solving such problem of the excessive close adhesion (Patent Literature 1). In a wafer surface protective tape formed of two layers, i.e., a base material film and a pressure-sensitive adhesive layer, a center line surface roughness Ra of the surface of the base material film opposite to the pressure-sensitive adhesive layer is controlled to a predetermined size.

However, the base material film of the pressure-sensitive adhesive tape to be used in the dicing of the semiconductor is required to have an expanding (stretching) characteristic and level difference-following characteristic peculiar to the semiconductor production process. That is, the base material film of the pressure-sensitive adhesive tape to be used in the dicing of the semiconductor needs to be capable of satisfactorily stretching in an expanding step and needs to follow the level difference of the semiconductor satisfactorily. A base material film formed of a material having a large elongation percentage is selected as a base material film that can respond to such requirements. However, the surface state of such base material film is susceptible to temperatures. Accordingly, the following problem arises. Even when the center line surface roughness Ra of the surface of the base material film is controlled to a predetermined size as reported in Patent Literature 1, the center line surface roughness Ra controlled to the predetermined size largely changes owing to a change in air temperature or a change in temperature of a processing apparatus, and hence an effect of the invention described in Patent Literature 1 cannot be expressed.

For example, at the time of the dicing, in particular, at the time of laser dicing, the wafer generates heat owing to energy produced by laser processing. When the wafer generates heat as described above, the following problem arises. Even when the center line surface roughness Ra of the surface of the base material film is controlled to a predetermined size as reported in Patent Literature 1, such problem of the excessive close adhesion as described above cannot be solved but instead the excessive close adhesion is accelerated.

In addition, in recent years, the size of the wafer to be used in the dicing of the semiconductor has been enlarging and hence a time period for the dicing has been lengthening. As a result, the quantity of heat to be generated by the wafer increases and hence the problem becomes additionally remarkable.

Particularly in LED dicing out of various kinds of semiconductor dicing, a semiconductor wafer to be used is constituted of an extremely brittle material such as gallium nitride, gallium arsenide, or silicon carbide. Accordingly, the base material film of the pressure-sensitive adhesive tape is required to have additionally high levels of the expanding (stretching) characteristic and level difference-following characteristic for preventing the breakage of the semiconductor wafer. Accordingly, the problem becomes additionally remarkable in the pressure-sensitive adhesive tape to be used in the LED dicing.

On the other hand, the surface of the film is generally smooth, and when such film is processed into a roll shape, a phenomenon in which different portions of the film are brought into contact with each other to closely adhere to each other, that is, blocking occurs. The roll in which the blocking has occurred may cause, for example, the following inconvenience. The operation of unwinding the film becomes difficult. In particular, a film having a large elongation percentage generally has a plasticizer added thereto. In such film, an adverse effect caused by the blocking becomes remarkable because a slight gap between the contacting portions of the film is filled by the deposition of the plasticizer on the surface of the film. When the surface of the film is subjected to pressure-sensitive adhesive processing with a pressure-sensitive adhesive, the adverse effect of the blocking becomes additionally large because the pressure-sensitive adhesive itself has adhesiveness.

When the roll-shaped film in which the blocking has occurred is unwound, extra force for releasing the close adhesion between the contacting portions of the film is needed. When such extra force is applied, the film elongates to deform, or even in the case where the film does not deform, the force is accumulated as stress strain. When the film that has deformed owing to such cause as described above is applied to the pressure-sensitive adhesive tape, it becomes difficult to attach the tape while following an adherend. In addition, when the film in which the stress strain has been accumulated by such cause as described above is applied to the pressure-sensitive adhesive tape, the adherend may break owing to the occurrence of natural release of the stress strain after the tape has been attached to the adherend.

When the pressure-sensitive adhesive tape is used in semiconductor processing, a semiconductor wafer as an adherend is brittle or liable to chip because the semiconductor wafer is constituted of a brittle material. Accordingly, when the film that has deformed owing to such cause as described above is applied to the pressure-sensitive adhesive tape, it becomes difficult to attach the tape while following a fine and intricate circuit pattern of the semiconductor wafer. In addition, when the film in which the stress strain has been accumulated by such cause as described above is applied to the pressure-sensitive adhesive tape, the semiconductor wafer easily breaks owing to the occurrence of natural release of the stress strain after the tape has been attached to the semiconductor wafer.

In particular, a wafer to be used in an LED is constituted of an extremely brittle material such as gallium nitride, gallium arsenide, or silicon carbide. Accordingly, the prevention of the blocking in the pressure-sensitive adhesive tape to be used in the LED dicing or the like is of particular importance.

Conventional technologies for preventing the blocking are roughly classified into two technologies.

One conventional technology is to subject the back surface of a film to a physical treatment such as embossing (Patent Literature 2). However, the technology involves the following problem. Unevenness formed on the back surface of the film serves as a stress concentration structure, and hence when the film is unwound from a roll shape, the film tears or breaks owing to the force of the unwinding with the unevenness as a starting point.

The other conventional technology is to apply a silicone release agent to the back surface of the film (Patent Literature 3). However, the technology involves the following problem. The silicone release agent hardly conforms to the back surface of the film because its chemical affinity for the back surface of the film is low owing to its surface tension. In addition, in the case where the film having the silicone release agent applied to its back surface is applied to the pressure-sensitive adhesive tape, the following problem may arise. When the stretching of the pressure-sensitive adhesive tape such as expanding is performed, a layer treated with the silicone release agent may be unable to follow the stretching and hence the treated layer is crushed to cause contamination. Although a technology involving applying a cross-linked silicone release agent is available for improving the chemical affinity of the silicone release agent for the back surface of the film, a cross-linked silicone generally has an extremely small elongation percentage, and hence in the case where the film having the cross-linked silicone release agent applied to its back surface is applied to the pressure-sensitive adhesive tape, the following problem arises. When the stretching of the pressure-sensitive adhesive tape such as expanding is performed, a layer treated with the cross-linked silicone release agent cannot follow the stretching and hence anchoring property cannot be maintained.

CITATION LIST

Patent Literature

[PTL 1] JP 2009-239124 A
[PTL 2] WO 2009/028068 A1
[PTL 3] JP 2010-201836 A

SUMMARY OF INVENTION

Technical Problem

An object of the present invention is to provide the following film for a pressure-sensitive adhesive tape in which a non-pressure-sensitive adhesive layer is provided on a base material film. In the case where dicing or the like is performed by performing adsorption fixation to a fixing base with a negative pressure, the occurrence of excessive close adhesion due to, for example, the heat generation of the base can be effectively suppressed. In addition, the non-pressure-sensitive adhesive layer is provided on the base material film, and hence blocking in a roll shape is effectively suppressed, the film for a pressure-sensitive adhesive tape does not tear or break upon its unwinding from the roll shape, conformity between the non-pressure-sensitive adhesive layer and the base material film is good, and followability to a deformation such as stretching is good. Another object of the present invention is to provide a pressure-sensitive adhesive tape including such film for a pressure-sensitive adhesive tape.

Solution to Problem

A film for a pressure-sensitive adhesive tape of the present invention a film for a pressure-sensitive adhesive tape, including a non-pressure-sensitive adhesive layer on one surface of a plastic film, in which: the non-pressure-sensitive adhesive layer includes a mixed layer of a silicone and a (meth)acrylic polymer; and the (meth)acrylic polymer has a calculated Tg of 10° C. or more.

In a preferred embodiment, the non-pressure-sensitive adhesive layer has an arithmetic average surface roughness Ra of 0.1 µm or more.

In a preferred embodiment, the (meth)acrylic polymer has an SP value of 9.0 $(cal/cm^3)^{0.5}$ to 12.0 $(cal/cm^3)^{0.5}$.

In a preferred embodiment, the non-pressure-sensitive adhesive layer has a phase-separated structure.

In a preferred embodiment, a mixing ratio "silicone:(meth)acrylic polymer" between the silicone and the (meth)acrylic polymer in the non-pressure-sensitive adhesive layer is 1:50 to 50:1 in terms of a weight ratio.

In a preferred embodiment, the non-pressure-sensitive adhesive layer has a non-pressure-sensitive adhesion test peel strength of less than 1.0 N/20 mm.

In a preferred embodiment, the non-pressure-sensitive adhesive layer has a thickness of 0.01 µm to 10 µm.

In a preferred embodiment, the plastic film has a maximum elongation measured in accordance with JIS-K-7127 of 100% or more.

In a preferred embodiment, the plastic film has a thickness of 20 µm to 200 µm.

In a preferred embodiment, the plastic film contains at least a polyvinyl chloride.

In another embodiment of the present invention, there is provided a pressure-sensitive adhesive tape. The pressure-sensitive adhesive tape of the present invention includes a pressure-sensitive adhesive layer on a surface of the plastic film in the film for a pressure-sensitive adhesive tape of the present invention opposite to the non-pressure-sensitive adhesive layer.

In a preferred embodiment, the pressure-sensitive adhesive layer contains at least one kind of (meth)acrylic polymer.

In a preferred embodiment, the pressure-sensitive adhesive layer has an SP value of 9.0 $(cal/cm^3)^{0.5}$ to 12.0 $(cal/cm^3)^{0.5}$.

In a preferred embodiment, the pressure-sensitive adhesive tape of the present invention further includes a release liner on a surface of the pressure-sensitive adhesive layer.

In a preferred embodiment, the pressure-sensitive adhesive tape of the present invention is used in semiconductor processing.

In a preferred embodiment, the pressure-sensitive adhesive tape of the present invention is used in an LED dicing application.

Advantageous Effects of Invention

According to one embodiment of the present invention, it is possible to provide the following film for a pressure-sensitive adhesive tape in which a non-pressure-sensitive adhesive layer is provided on a base material film. In the case where dicing or the like is performed by performing adsorption fixation to a fixing base with a negative pressure, the occurrence of excessive close adhesion due to, for example, the heat generation of the base can be effectively suppressed. In addition, the non-pressure-sensitive adhesive layer is provided on the base material film, and hence blocking in a roll shape is effectively suppressed, the film for a pressure-sensitive adhesive tape does not tear or break upon its unwinding from the roll shape, conformity between the non-pressure-sensitive adhesive layer and the base material film is good, and followability to a deformation such as stretching is good. According to another embodiment of the present invention, it is possible to provide the pressure-sensitive adhesive tape including such film for a pressure-sensitive adhesive tape.

DESCRIPTION OF EMBODIMENTS

<<1. Film for pressure-sensitive adhesive tape>>

A film for a pressure-sensitive adhesive tape of the present invention includes a non-pressure-sensitive adhesive layer on one surface of a plastic film.

<1-1. Plastic film>

The plastic film is not particularly limited and can contain any appropriate resin material. Preferred examples of such resin material include a polyvinyl chloride, a polyolefin, a polyester, a polyimide, and a polyamide, more preferred examples thereof include a polyvinyl chloride and a polyolefin, and a still more preferred example thereof is a polyvinyl chloride. The polyvinyl chloride can be particularly suitably used in a film for a pressure-sensitive adhesive tape that can be used in a pressure-sensitive adhesive tape to be used in semiconductor processing such as LED dicing because the polyvinyl chloride is excellent in stress relaxation property.

The content of the resin material in the plastic film can be set to any appropriate content depending on purposes and applications. Such content is, for example, preferably 50 wt % to 100 wt %, more preferably 60 wt % to 100 wt %, still more preferably 70 wt % to 100 wt %.

A plasticizer may be incorporated into the plastic film. The content of the plasticizer in the plastic film is preferably 0.5 wt % to 50 wt %, more preferably 1.0 wt % to 40 wt % with respect to the resin material in the plastic film. The incorporation of the plasticizer into the plastic film at the content additionally improves followability to a deformation such as stretching.

Examples of the plasticizer include a phthalic acid ester-based plasticizer, a trimellitic acid ester-based plasticizer (such as a W-700 manufactured by DIC Corporation or trioctyl trimellitate), an adipic acid ester-based plasticizer (such as a D620 manufactured by J-PLUS Co., Ltd., dioctyl adipate, or diisononyl adipate), a phosphoric acid ester-based plasticizer (such as tricresyl phosphate), an adipic acid-based ester, a citric acid ester (such as tributyl acetyl-citrate), a sebacic acid ester, an azelaic acid ester, a maleic acid ester, a benzoic acid ester, a polyether-based polyester, an epoxy-based polyester (such as epoxidized soybean oil or epoxidized linseed oil), and a polyester (such as a low-molecular weight polyester formed of a carboxylic acid and a glycol). In the present invention, an ester-based plasticizer is preferably used. The plasticizers may be used alone or in combination.

Any appropriate other component may be incorporated into the plastic film to such an extent that the effects of the present invention are not impaired.

The plastic film has a maximum elongation measured in accordance with JIS-K-7127 of preferably 100% or more, more preferably 200% to 1,000%. The use of the plastic film showing such maximum elongation can impart moderate elongation property to the film for a pressure-sensitive adhesive tape of the present invention, and for example, when the film for a pressure-sensitive adhesive tape of the present invention is used in a pressure-sensitive adhesive tape, the use can improve its followability to an adherend.

The plastic film has a thickness of preferably 20 µm to 200 µm, more preferably 40 µm to 150 µm, still more preferably 50 µm to 100 µm. When the thickness of the plastic film is less than 20 µm, handleability may deteriorate. In particular, when a pressure-sensitive adhesive tape is constituted, the operation of attaching the tape may become difficult. When the thickness of the plastic film is more than 200 µm, the followability to a deformation such as stretching may deteriorate.

<1-2. Non-pressure-sensitive adhesive layer>

The non-pressure-sensitive adhesive layer is a mixed layer of a silicone and a (meth)acrylic polymer. When the non-pressure-sensitive adhesive layer is the mixed layer of the silicone and the (meth)acrylic polymer, conformity between the non-pressure-sensitive adhesive layer and the plastic film improves, and the film for a pressure-sensitive adhesive tape of the present invention and a pressure-sensitive adhesive tape including the film each have good followability to a deformation such as stretching.

The (meth)acrylic polymer in the non-pressure-sensitive adhesive layer has a calculated Tg of 10° C. or more, preferably 20° C. or more, more preferably 30° C. or more, still more preferably 45° C. or more. An upper limit for the calculated Tg of the (meth)acrylic polymer in the non-pressure-sensitive adhesive layer, which is not particularly limited, is preferably 200° C. or less, more preferably 150° C. or less, still more preferably 100° C. or less. When the calculated Tg of the (meth)acrylic polymer in the non-pressure-sensitive adhesive layer falls within the range, heat resistance in the minute uneven structure of the surface of the non-pressure-sensitive adhesive layer improves, and hence in the case where dicing or the like is performed by performing the adsorption fixation of the film for a pressure-sensitive adhesive tape of the present invention to a fixing base with a negative pressure, the occurrence of excessive close adhesion due to, for example, the heat generation of the base can be effectively suppressed.

The "calculated Tg" of a copolymer (such as the (meth) acrylic polymer in the non-pressure-sensitive adhesive layer) in the present invention is a calculated glass transition temperature determined from Fox's calculation equation for the Tg of a structural unit derived from a monomer constituting the copolymer. Fox's equation is such a relational equation between the glass transition temperature Tg (° C.) of the copolymer and a glass transition temperature Tgi (° C.) of a homopolymer obtained by the homopolymerization of each monomer constituting the copolymer as described below. It should be noted that in Fox's equation below, Tg (° C.) represents the glass transition temperature of the copolymer, Wi represents the weight fraction of a monomer i, and Tgi (° C.) represents the glass transition temperature of a homopolymer of the monomer i.

$$1/(273+Tg)=\Sigma(Wi/(273+Tgi))$$

It should be noted that specifically, a value described in the "Polymer Handbook 3rd Edition" (A WILEY-INTERSCIENCE PUBLICATION, 1989) can be used as the glass transition temperature Tgi (° C.) of the homopolymer.

The non-pressure-sensitive adhesive layer has an arithmetic average surface roughness Ra of preferably 0.1 μm or more, more preferably 0.1 μm to 3.0 μm, still more preferably 0.2 μm to 2.0 μm, particularly preferably 0.3 μm to 2.0 μm, most preferably 0.5 μm to 2.0 μm. When the arithmetic average surface roughness Ra of the non-pressure-sensitive adhesive layer falls within the range, the occurrence of the excessive close adhesion can be suppressed in the case where the adsorption fixation with a negative pressure is performed.

The (meth)acrylic polymer in the non-pressure-sensitive adhesive layer has an SP value of preferably 9.0 $(cal/cm^3)^{0.5}$ to 12.0 $(cal/cm^3)^{0.5}$, more preferably 9.5 $(cal/cm^3)^{0.5}$ to 11.5 $(cal/cm^3)^{0.5}$, still more preferably 9.5 $(cal/cm^3)^{0.5}$ to 11.0 $(cal/cm^3)^{0.5}$. The SP value is a solubility parameter calculated from Small's equation. The calculation of the SP value can be performed by a method described in a known document (such as the Journal of Applied Chemistry, 3, 71, 1953.).

The non-pressure-sensitive adhesive layer preferably has a phase-separated structure. When the non-pressure-sensitive adhesive layer has the phase-separated structure, a minute uneven structure can be efficiently formed on the surface of the non-pressure-sensitive adhesive layer. This is probably because of the following reason: the unevenness is produced by a difference in substance mobility between the silicone and the (meth)acrylic polymer at the time of the production of the phase-separated structure. The formation of the uneven structure can suppress the occurrence of the excessive close adhesion in the case where the adsorption fixation of the film for a pressure-sensitive adhesive tape of the present invention is performed with a negative pressure. In addition, the formation can effectively suppress blocking in a roll shape and can suppress the tear or breakage of the film upon its unwinding from the roll shape.

The non-pressure-sensitive adhesive layer preferably includes a silicone-rich phase containing a larger amount of the silicone than that of the (meth)acrylic polymer and a (meth)acrylic polymer-rich phase containing a larger amount of the (meth)acrylic polymer than that of the silicone. More specifically, the non-pressure-sensitive adhesive layer preferably includes a phase-separated structure in which the silicone-rich phase and the (meth)acrylic polymer-rich phase are independent of each other, and it is more preferred that the silicone-rich phase be present on an air interface side (side opposite to the plastic film) and the (meth)acrylic polymer-rich phase be present on a plastic film side. When the layer has such phase-separated structure, the blocking is effectively suppressed by the silicone-rich phase present on the air interface side. In addition, the conformity between the non-pressure-sensitive adhesive layer and the plastic film is improved by the (meth)acrylic polymer-rich phase present on the plastic film side, and hence the deformation followability improves. Such phase-separated structure can be formed by adjusting a mixing ratio between the silicone and (meth)acrylic polymer in the non-pressure-sensitive adhesive layer as described below.

The fact that the non-pressure-sensitive adhesive layer has the phase-separated structure or the fact that the layer includes the silicone-rich phase containing a larger amount of the silicone than that of the (meth)acrylic polymer and the (meth)acrylic polymer-rich phase containing a larger amount of the (meth)acrylic polymer than that of the silicone as described above can be observed by any appropriate method. Such observation method is, for example, a method involving subjecting a section of the non-pressure-sensitive adhesive layer to shape observation with an electron microscope such as a transmission electron microscope (TEM), a scanning electron microscope (SEM), or a field emission-scanning electron microscope (FE-SEM). The bilayer separated structure can be recognized on the basis of the light and shade of a shape observation image. Also available is, for example, a method for the observation involving observing a change in content of silicon, carbon, or the like in composition by infrared absorption spectroscopy based on a total reflection method while changing a probe light depth from the air interface side of the non-pressure-sensitive adhesive layer to its inside. In addition, for example, a method involving observing such fact by means of an X-ray microanalyzer or X-ray photoelectron spectroscopy is available. Alternatively, such fact may be observed by an appropriate combination of those methods.

The mixing ratio between the silicone and (meth)acrylic polymer in the non-pressure-sensitive adhesive layer is as follows in terms of a weight ratio: the ratio "silicone:(meth) acrylic polymer" is preferably 1:50 to 50:1, the ratio "silicone:(meth)acrylic polymer" is more preferably 1:30 to 30:1, the ratio "silicone:(meth)acrylic polymer" is still more preferably 1:10 to 10:1, the ratio "silicone:(meth)acrylic polymer" is particularly preferably 1:5 to 5:1, and the ratio "silicone:(meth)acrylic polymer" is most preferably 1:3 to 5:1. When the content of the silicone in the non-pressure-sensitive adhesive layer is excessively large, there is a possibility that the chemical affinity of the layer for the back surface of the plastic film reduces and hence the layer hardly conforms to the back surface of the plastic film. In addition, when the content of the silicone in the non-pressure-sensitive adhesive layer is excessively large, in the case where a film for a pressure-sensitive adhesive tape or a pressure-sensitive adhesive tape including the film is produced, there is a possibility that its followability to a deformation such as stretching deteriorates and hence the non-pressure-sensitive adhesive layer is crushed to cause contamination. When the content of the (meth)acrylic) acrylic polymer in the non-pressure-sensitive adhesive layer is excessively large, the non-pressure-sensitive adhesive layer may act as an acrylic pressure-sensitive adhesive and the blocking may be liable to occur.

Any appropriate silicone can be adopted as the silicone. Examples of such silicone include: an addition-type silicone obtained by curing an alkenyl group-containing polydialkylsiloxane and a polydialkylhydrogen polysiloxane through an addition reaction with a platinum-based compound as a catalyst to form a peelable coating film; and a condensation-type silicone obtained by causing a methylol group-containing polydialkylsiloxane and a polydialkylhydrogen polysiloxane to react with each other with a tin-based catalyst. Examples of the addition-type silicone include a "KS-776A" and a "KS-839L" manufactured by Shin-Etsu Silicone. The condensation-type silicone is, for example, a "KS723A/B" manufactured by Shin-Etsu Silicone. It should be noted that upon production of the silicone, any other cross-linking agent, cross-linking accelerator, or the like may be appropriately used in addition to the platinum-based catalyst or the tin-based catalyst. In addition, the properties of the silicone are classified into, for example, a type in which the silicone is dissolved in an organic solvent such as toluene, an emulsion type in which the silicone and the organic solvent are emulsified, and a solventless type formed only of the silicone. Further, for example, a silicone-acrylic graft polymer and a silicone-acrylic block polymer can be used in addition to the addition-type silicone and the condensation-type silicone. Examples of the silicone-acrylic graft polymer include Symac GS-30, GS101, US-270, US-350, and US-380 (all of which are manufactured by TOAGOSEI CO., LTD.). Examples of the silicone-acrylic block polymer include MODIPER FS700, FS710, FS720, FS730, and FS770 (all of which are manufactured by NOF CORPORATION).

Any appropriate (meth)acrylic polymer can be adopted as the (meth)acrylic polymer as long as its calculated Tg is 10° C. or more. In addition, the term "(meth)acryl" in the present invention means "acryl and/or methacryl."

The (meth)acrylic polymer is a polymer constituted of monomer components containing a (meth)acrylic monomer as a main monomer. The content of the (meth)acrylic monomer in the monomer components constituting the (meth)acrylic polymer is preferably 50 wt % or more, more preferably 70 wt % to 100 wt %, still more preferably 90 wt % to 100 wt %, particularly preferably 95 wt % to 100 wt %. The number of kinds of the monomers in the monomer components may be only one, or may be two or more.

Preferred examples of the (meth)acrylic monomer include a (meth)acrylic acid ester and (meth)acrylic acid.

Examples of the (meth)acrylic acid ester include: an alkyl (meth)acrylate containing an alkyl group (including a cycloalkyl group) having 1 to 30 carbon atoms; and a hydroxyl group-containing (meth)acrylic acid ester. The (meth)acrylic acid esters may be used alone or in combination.

Examples of the alkyl (meth)acrylate containing an alkyl group (including a cycloalkyl group) having 1 to 30 carbon atoms include alkyl (meth)acrylates each containing an alkyl group (including a cycloalkyl group) having 1 to 30 carbon atoms, such as methyl (meth)acrylate, ethyl (meth)acrylate, propyl (meth)acrylate, isopropyl (meth)acrylate, butyl (meth)acrylate, isobutyl (meth)acrylate, sec-butyl (meth) acrylate, t-butyl (meth)acrylate, pentyl (meth)acrylate, amyl (meth)acrylate, hexyl (meth)acrylate, cyclohexyl (meth) acrylate, heptyl (meth)acrylate, 2-ethylhexyl (meth)acrylate, octyl (meth)acrylate, isooctyl (meth)acrylate, nonyl (meth) acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth) acrylate, pentadecyl (meth)acrylate, octadecyl (meth)acrylate, nonadecyl (meth)acrylate, eicosyl (meth)acrylate, and lauryl (meth)acrylate. Of those (meth)acrylic acid esters, an alkyl (meth)acrylate containing an alkyl group (including a cycloalkyl group) having 2 to 20 carbon atoms is preferred, and an alkyl (meth)acrylate containing an alkyl group (including a cycloalkyl group) having 4 to 18 carbon atoms is more preferred.

Examples of the hydroxyl group-containing (meth)acrylic acid ester include 2-hydroxyethyl (meth)acrylate, 2-hydroxypropyl (meth)acrylate, and 4-hydroxybutyl (meth) acrylate.

The monomer components constituting the (meth)acrylic polymer may contain at least one kind selected from a hydroxyl group-containing monomer and a carboxyl group-containing monomer in order to sufficiently express the effects of the present invention.

Examples of the hydroxyl group-containing monomer include allyl alcohol. The hydroxyl group-containing monomers may be used alone or in combination.

Examples of the carboxyl group-containing monomer include carboxyethyl (meth)acrylate, carboxypentyl (meth) acrylate, crotonic acid, maleic acid, fumaric acid, and itaconic acid. The carboxyl group-containing monomers may be used alone or in combination.

The (meth)acrylic polymer in the non-pressure-sensitive adhesive layer is preferably as follows: the content of the hydroxyl group-containing (meth)acrylic acid ester in the monomer components constituting the polymer is preferably 2 wt % to 30 wt %, more preferably 3 wt % to 25 wt %, particularly preferably 5 wt % to 20 wt % with respect to the total amount of the monomer components except the hydroxyl group-containing (meth)acrylic acid ester. When the content of the hydroxyl group-containing (meth)acrylic acid ester in the monomer components constituting the (meth)acrylic polymer in the non-pressure-sensitive adhesive layer falls within the range with respect to the total amount of the monomer components except the hydroxyl group-containing (meth)acrylic acid ester, the minute uneven structure is formed on the surface of the non-pressure-sensitive adhesive layer in an additionally efficient manner, and the formation of the uneven structure can additionally suppress the occurrence of the excessive close adhesion in the case where the adsorption fixation of the film for a pressure-sensitive adhesive tape of the present invention is performed with a negative pressure. In addition, the formation can suppress the blocking in the roll shape in an additionally effective manner and can additionally suppress the tear or breakage of the film upon its unwinding from the roll shape.

The (meth)acrylic polymer in the non-pressure-sensitive adhesive layer can preferably contain (meth)acrylic acid and/or a (meth)acrylic acid ester in the monomer components except the hydroxyl group-containing (meth)acrylic acid ester in the monomer components constituting the polymer. In this case, a content ratio "(meth)acrylic acid: (meth)acrylic acid ester" between (meth)acrylic acid and the (meth)acrylic acid ester is preferably 0:100 to 20:80, more preferably 0:100 to 10:90, still more preferably 0:100 to 5:95 in terms of a weight ratio.

When the content ratio between (meth)acrylic acid and the (meth)acrylic acid ester falls within the range, the minute uneven structure is formed on the surface of the non-pressure-sensitive adhesive layer in an additionally efficient manner, and the formation of the uneven structure can additionally suppress the occurrence of the excessive close adhesion in the case where the adsorption fixation of the film for a pressure-sensitive adhesive tape of the present invention is performed with a negative pressure. In addition, the formation can suppress the blocking in the roll shape in an additionally effective manner and can additionally suppress the tear or breakage of the film upon its unwinding from the roll shape.

The (meth)acrylic polymer can be produced by any appropriate polymerization method.

Any appropriate additive may be incorporated into the non-pressure-sensitive adhesive layer as long as the effects of the present invention are not impaired. Examples of such additive include a catalyst, a UV absorbing agent, a filler, an antioxidant, a tackifier, a pigment, a dye, and a silane coupling agent.

The non-pressure-sensitive adhesive layer has a non-pressure-sensitive adhesion test peel strength of preferably less than 1.0 N/20 mm, more preferably less than 0.5 N/20 mm, still more preferably less than 0.2 N/20 mm. When the non-pressure-sensitive adhesion test peel strength of the non-pressure-sensitive adhesive layer falls within the range, the occurrence of the excessive close adhesion can be additionally suppressed in the case where the adsorption fixation with a negative pressure is performed. In the present invention, the non-pressure-sensitive adhesion test peel strength of the non-pressure-sensitive adhesive layer is measured on the basis of a method to be described later.

The non-pressure-sensitive adhesive layer has a thickness of preferably 0.01 µm to 10 µm, more preferably 0.1 µm to 5 µm, still more preferably 0.1 µm to 2 µm. When the thickness of the non-pressure-sensitive adhesive layer is less than 0.01 µm, the blocking is liable to occur. When the thickness of the non-pressure-sensitive adhesive layer is more than 10 µm, the followability to a deformation such as stretching may deteriorate. When the thickness of the non-pressure-sensitive adhesive layer is less than 0.01 µm, the effects of the present invention may be hardly expressed or the production of the film may become difficult.

A method of forming the non-pressure-sensitive adhesive layer on one surface of the plastic film is, for example, a method involving applying a material for the non-pressure-sensitive adhesive layer to the one surface of the plastic film and drying the material to form the non-pressure-sensitive adhesive layer. A method for the application is, for example, a method involving using a bar coater, a gravure coater, a spin coater, a roll coater, a knife coater, or an applicator.

<<2. Pressure-sensitive adhesive tape>>

A pressure-sensitive adhesive tape of the present invention includes a pressure-sensitive adhesive layer on the surface of the plastic film in the film for a pressure-sensitive adhesive tape of the present invention opposite to the non-pressure-sensitive adhesive layer.

The thickness of the pressure-sensitive adhesive layer is not particularly limited, and is preferably 1.0 µm to 30 µm, more preferably 1.0 µm to 20 µm, still more preferably 3.0 µm to 15 µm. When the thickness of the pressure-sensitive adhesive layer is less than 1.0 µm, the layer may be unable to express a sufficient adhesion. When the thickness of the pressure-sensitive adhesive layer is more than 30 µm, its adhesion becomes so large depending on applications that an adherend may be crushed upon peeling or the like.

Any appropriate pressure-sensitive adhesive can be adopted as a material for the pressure-sensitive adhesive layer as long as the effects of the present invention are not impaired.

Examples of the material for the pressure-sensitive adhesive layer include: a (meth)acrylic polymer; a natural rubber; a special natural rubber obtained by grafting a monomer such as methyl methacrylate; and a synthetic rubber such as SBS, SBR, SEPS, SIS, SEBS, a polybutene, a polyisobutene, a polyisobutylene, or a butyl rubber. Of those, a (meth)acrylic polymer is preferred because the polymer shows a small amount of an adhesive residue on an adherend after peeling, has high cohesiveness, and is excellent in transparency.

When the pressure-sensitive adhesive layer contains the (meth)acrylic polymer, the content of the (meth)acrylic polymer in the pressure-sensitive adhesive layer can be appropriately set depending on purposes.

The (meth)acrylic polymer is a resin constituted of monomer components containing a (meth)acrylic monomer as a main monomer. The content of the (meth)acrylic monomer in the monomer components constituting the (meth)acrylic polymer is preferably 50 wt % or more, more preferably 70 wt % to 100 wt %, still more preferably 90 wt % to 100 wt %, particularly preferably 95 wt % to 100 wt %. The number of kinds of the monomers in the monomer components may be only one, or may be two or more.

Preferred examples of the (meth)acrylic monomer include a (meth)acrylic acid ester and (meth)acrylic acid.

Examples of the (meth)acrylic acid ester include: an alkyl (meth)acrylate containing an alkyl group (including a cycloalkyl group) having 1 to 30 carbon atoms; and a hydroxyl group-containing (meth)acryliac acid ester. The (meth)acrylic acid esters may be used alone or in combination.

Examples of the alkyl (meth)acrylate containing an alkyl group (including a cycloalkyl group) having 1 to 30 carbon atoms include alkyl (meth)acrylates each containing an alkyl group (including a cycloalkyl group) having 1 to 30 carbon atoms, such as methyl (meth)acrylate, ethyl (meth)acrylate, propyl (meth)acrylate, isopropyl (meth)acrylate, butyl (meth)acrylate, isobutyl (meth)acrylate, sec-butyl (meth)acrylate, t-butyl (meth)acrylate, pentyl (meth)acrylate, amyl (meth)acrylate, hexyl (meth)acrylate, cyclohexyl (meth)acrylate, heptyl (meth)acrylate, 2-ethylhexyl (meth)acrylate, octyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, octadecyl (meth)acrylate, nonadecyl (meth)acrylate, eicosyl (meth)acrylate, and lauryl (meth)acrylate. Of those (meth)acrylic acid esters, an alkyl (meth)acrylate containing an alkyl group (including a cycloalkyl group) having 2 to 20 carbon atoms is preferred, and an alkyl (meth)acrylate containing an alkyl group (including a cycloalkyl group) having 4 to 18 carbon atoms is more preferred.

Examples of the hydroxyl group-containing (meth)acrylic acid ester include 2-hydroxyethyl (meth)acrylate, 2-hydroxypropyl (meth)acrylate, and 4-hydroxybutyl (meth)acrylate.

The monomer components constituting the (meth)acrylic polymer preferably contain at least one kind selected from a hydroxyl group-containing monomer and a carboxyl group-containing monomer for causing the polymer to express an effect as a pressure-sensitive adhesive sufficiently. Of those, a carboxyl group-containing monomer is more preferred. In addition, the monomer components constituting the (meth)acrylic polymer can contain acrylonitrile for causing the polymer to express the effect as a pressure-sensitive adhesive sufficiently.

Examples of the hydroxyl group-containing monomer include 2-hydroxyethyl (meth)acrylate, 2-hydroxypropyl (meth)acrylate, 4-hydroxybutyl (meth)acrylate, and ally alcohol. The hydroxyl group-containing monomers may be used alone or in combination.

Examples of the carboxyl group-containing monomer include (meth)acrylic acid, carboxyethyl (meth)acrylate, carboxypentyl (meth)acrylate, crotonic acid, maleic acid, fumaric acid, and itaconic acid. The carboxyl group-containing monomers may be used alone or in combination.

When the monomer components constituting the (meth)acrylic polymer contain the hydroxyl group-containing monomer, the content of the hydroxyl group-containing monomer in the monomer components constituting the (meth)acrylic polymer is preferably 0.1 wt % to 20 wt %, more preferably 0.1 wt % to 10 wt %. When the monomer components constituting the (meth)acrylic polymer contains the carboxyl group-containing monomer, the content of the carboxyl group-containing monomer in the monomer components constituting the (meth)acrylic polymer is preferably 0.1 wt % to 20 wt %, more preferably 0.1 wt % to 10 wt %. When the monomer components constituting the (meth)acrylic polymer contain at least one kind selected from the hydroxyl group-containing monomer and the carboxyl group-containing monomer as described above, in the case where a cross-linking agent is used, a cross-linking reaction with the cross-linking agent can be efficiently caused and the effect as a pressure-sensitive adhesive can be sufficiently expressed. Further, the crush of an adherend at the time of a peeling operation can be effectively prevented by adjusting the content of the hydroxyl group-containing monomer in the monomer components constituting the (meth)acrylic polymer or the content of the carboxyl group-containing monomer in the monomer components constituting the (meth)acrylic polymer so that the content may fall within the range. When the content of the hydroxyl group-containing monomer in the monomer components constituting the (meth)acrylic polymer or the content of the carboxyl group-containing monomer in the monomer components constituting the (meth)acrylic polymer outstrips the range, the adhesion of the pressure-sensitive adhesive layer becomes so large that the blocking may be liable to occur and the crush of the adherend may be liable to occur at the time of the peeling operation.

The pressure-sensitive adhesive layer preferably contains a cross-linking agent. When the pressure-sensitive adhesive layer contains the cross-linking agent, the content of the cross-linking agent in the pressure-sensitive adhesive layer, which can be appropriately set depending on purposes, is preferably 0.1 wt % to 20 wt % with respect to a main resin component (preferably the (meth)acrylic polymer). Causing the content of the cross-linking agent in the pressure-sensitive adhesive layer to fall within the range can cause a moderate cross-linking reaction and can effectively prevent the crush of the adherend at the time of the peeling operation.

Examples of the cross-linking agent include an epoxy-based cross-linking agent, an isocyanate-based cross-linking agent, a melamine-based cross-linking agent, a peroxide-based cross-linking agent, a metal alkoxide-based cross-linking agent, a metal chelate-based cross-linking agent, a metal salt-based cross-linking agent, a carbodiimide-based cross-linking agent, an oxazoline-based cross-linking agent, an aziridine-based cross-linking agent, and an amine-based cross-linking agent. Of those cross-linking agents, from the viewpoint of being able to express the effects of the present invention sufficiently, a melamine-based cross-linking agent, an epoxy-based cross-linking agent, and an isocyanate-based cross-linking agent are preferred. In addition, the cross-linking agents may be appropriately selected as required, and may be used alone or in combination.

The pressure-sensitive adhesive layer may contain a plasticizer. When the pressure-sensitive adhesive layer contains the plasticizer, the content of the plasticizer in the pressure-sensitive adhesive layer, which can be appropriately set depending on purposes, is preferably 0.1 wt % to 50 wt %. Causing the content of the plasticizer in the pressure-sensitive adhesive layer to fall within the range enables additionally effective expression of the effects of the present invention. When the content of the plasticizer in the pressure-sensitive adhesive layer is larger than 50 wt %, the pressure-sensitive adhesive layer becomes so soft that an adhesive residue or adherend contamination may be liable to occur.

Examples of the plasticizer include a phthalic acid ester-based plasticizer, a trimellitic acid ester-based plasticizer (such as a W-700 manufactured by DIC Corporation or trioctyl trimellitate), an adipic acid ester-based plasticizer (such as a D620 manufactured by J-PLUS Co., Ltd., dioctyl adipate, or diisononyl adipate), a phosphoric acid ester-based plasticizer (such as tricresyl phosphate), an adipic acid-based ester, a citric acid ester (such as tributyl acetylcitrate), a sebacic acid ester, an azelaic acid ester, a maleic acid ester, a benzoic acid ester, a polyether-based polyester, an epoxy-based polyester (such as epoxidized soybean oil or epoxidized linseed oil), and a polyester (such as a low-molecular weight polyester formed of a carboxylic acid and a glycol). In the present invention, an ester-based plasticizer is preferably used. The plasticizers may be used alone or in combination.

The pressure-sensitive adhesive layer may contain any appropriate catalyst for accelerating a cross-linking reaction or the like. When the pressure-sensitive adhesive layer contains the catalyst, the content of the catalyst in the pressure-sensitive adhesive layer, which can be appropriately set depending on purposes, is preferably 0.01 wt % to 10 wt %. Causing the content of the catalyst in the pressure-sensitive adhesive layer to fall within the range enables additionally effective expression of the effects of the present invention.

Examples of such catalyst include: organometallic compounds such as tetraisopropyl titanate, tetra-n-butyl titanate, tin oclylate, lead octylate, cobalt octylate, zinc octylate, calcium octylate, lead naphthenate, cobalt naphthenate, dibutyltin diacetate, dibutyltin dioctoate, dibutyltin dilaurate, dioctyltin dilaurate, and dibutyltin maleate; basic compounds such as butylamine, dibutylamine, hexylamine, t-butylamine, ethylenediamine, isophoronediamine, imidazole, lithium hydroxide, potassium hydroxide, and sodium methylate; and acidic compounds such as p-toluenesulfonic acid, trichloroacetic acid, phosphoric acid, a monoalkyl phosphate, a dialkyl phosphate, a phosphate of β-hydroxyethyl acrylate, a monoalkyl phosphite, and a dialkyl phosphite. The catalysts may be used alone or in combination.

The pressure-sensitive adhesive layer has an SP value of preferably 9.0 $(cal/cm^3)^{0.5}$ to 12.0 $(cal/cm^3)^{0.5}$, more preferably 9.5 $(cal/cm^3)^{0.5}$ to 11.0 $(cal/cm^3)^{0.5}$ in order that the effects of the present invention may be additionally expressed. The SP value is a solubility parameter calculated from Small's equation. The calculation of the SP value can be performed by a method described in a known document (such as the Journal of Applied Chemistry, 3, 71, 1953.).

Any appropriate additive may be incorporated into the pressure-sensitive adhesive layer as long as the effects of the present invention are not impaired. Examples of such additive include a UV absorbing agent, a filler, an antioxidant, a tackifier, a pigment, a dye, and a silane coupling agent.

The pressure-sensitive adhesive tape of the present invention may include a release liner on the surface of the pressure-sensitive adhesive layer.

Any appropriate separator can be adopted as the release liner. Examples of such release liner include: a base material having a release layer such as a plastic film or paper subjected to a surface treatment with a releasing agent such as a silicone-based releasing agent, a long-chain alkyl-based releasing agent, a fluorine-based releasing agent, or molybdenum sulfide; a lowly adhesive base material formed of a fluorine-based polymer such as a polytetrafluoroethylene, a polychlorotrifluoroethylene, a polyvinyl fluoride, a polyvinylidene fluoride, a tetrafluoroethylene-hexafluoropropylene copolymer, or a chlorofluoroethylene-vinylidene fluoride copolymer; and a lowly adhesive base material formed of a nonpolar polymer such as an olefin-based resin (e.g., a polyethylene or a polypropylene).

The pressure-sensitive adhesive tape of the present invention can be used in any appropriate application. The pressure-sensitive adhesive tape of the present invention has the film for a pressure-sensitive adhesive tape of the present invention. Accordingly, as described above, in the case where dicing or the like is performed by performing adsorption fixation to a fixing base with a negative pressure, the occurrence of excessive close adhesion due to, for example, the heat generation of the base can be effectively suppressed. In addition, blocking in a roll shape is effectively suppressed, the tape does not tear or break upon its unwinding from the roll shape, conformity between the non-pressure-sensitive adhesive layer and the plastic film is good, and followability to a deformation such as stretching is good. Therefore, the tape can be suitably used in semiconductor processing in which a semiconductor wafer that is constituted of a brittle material, and can have a fine and intricate circuit pattern is used as an adherend. When the pressure-sensitive adhesive tape of the present invention is used in the semiconductor processing, in the case where dicing or the like is performed by performing adsorption fixation to a fixing base with a negative pressure, the occurrence of excessive close adhesion due to, for example, the heat generation of the base can be effectively suppressed and hence a semiconductor production process including the dicing can be smoothly progressed. In addition, when the pressure-sensitive adhesive tape of the present invention is used in the semiconductor processing, a film deformation or the accumulation of stress strain which has heretofore been occurring owing to the blocking does not occur, and hence the tape can be attached while accurately following the fine and intricate circuit pattern of the semiconductor wafer. In addition, natural release of the stress strain after the tape has been attached to the semiconductor wafer does not occur and hence the crush of the semiconductor wafer can be effectively prevented. In particular, a wafer to be used in an LED is constituted of an extremely brittle material such as gallium nitride, gallium arsenide, or silicon carbide. Accordingly, the pressure-sensitive adhesive tape of the present invention is extremely suitable for LED dicing or the like.

EXAMPLES

Hereinafter, the present invention is specifically described by way of Examples. However, the present invention is by no means limited to Examples shown below. The term "part(s)" means "part(s) by weight." In addition, the amount of a reagent supplied as a solution is represented by the amount of a solid content remaining after the volatilization of the solution (amount in terms of the solid content).

<Maximum elongation>
A maximum elongation was measured with an Instron-type tensile tester (Autograph manufactured by Shimadzu Corporation) in accordance with JIS-K-7127. Specifically, a sample measuring 20 mm wide by 100 mm long was placed with a chuck-to-chuck distance of 50 mm. After that, the sample was pulled at a pulling rate of 0.3 m/min and a value at the time of its rupture was measured.
<Modulus of elasticity>
A modulus of elasticity was measured in accordance with JIS-K-7127.
<Observation of non-pressure-sensitive adhesive layer>
(Observation with SEM)
A section of a non-pressure-sensitive adhesive layer was processed so as to be observable, followed by shape observation with a scanning electron microscope (SEM).
(Observation by attenuated total reflection infrared spectroscopy (ATR-IR))
The ATR-IR measurement of the non-pressure-sensitive adhesive layer was performed with an infrared spectrometer (Spectrum One manufactured by Perkinermer) while a total reflection measurement method was selected, and two kinds of prisms for total reflection measurement (ZnSe 45° and Ge 45°) were used for changing the analysis depth of probe light.
<Arithmetic average surface roughness Ra>
Measurement was performed with a confocal laser microscope "LEXT3000" manufactured by Olympus Corporation at a magnification of an objective lens of 20 in a 3D mode. The observation range of the 3D mode was determined by setting the positions at which a confocal image (CF image) became pitch-dark when the lens was vertically moved as the top and bottom of the observation range.

An image capture method in the 3D mode was as follows: image capture was performed by a step system at a pitch of 0.2 μm.

An arithmetic average surface roughness Ra was measured as follows: the Ra at any appropriate place was measured by the roughness analysis of an analysis mode. It should be noted that the value was determined by averaging n measured values (where n=5).
<Adsorption test in high-temperature state>
A film for a pressure-sensitive adhesive tape or a pressure-sensitive adhesive tape was attached to a slide glass having a longitudinal length of 20 mm and a lateral length of 50 mm so that its back surface (in each of Examples and Comparative Examples, a surface on a non-pressure-sensitive adhesive layer side in the case of the film for a pressure-sensitive adhesive tape or a surface opposite to a pressure-sensitive adhesive layer in the case of the pressure-sensitive adhesive tape) served as the front. Next, the slide glass having attached thereto the tape and a slide glass (an edge-ground product of a blue plate, sizes: 65 mm×165 mm×1.35 mmt) to serve as an adherend were left to stand under an 80° C. environment for 15 minutes while the back surface side of the slide glass having attached thereto the tape and the non-tin surface side of the slide glass were brought into contact with each other. After that, the slide glass and the back surface of the slide glass having attached thereto the tape were attached to each other by reciprocating a 2-kg roller once, and then the resultant was left to stand under the 80° C. environment for 30 minutes. After the standing, the resultant was cooled to normal temperature and then 0° peeling was performed with an Instron-type tensile tester (Autograph manufactured by Shimadzu Corporation) at a pulling rate of 0.3 m/min. A peel strength (maximum value) at that time was measured and evaluated by the following criteria.
○: The peel strength is less than 5.0 N.
Δ: The peel strength is 5.0 N or more and less than 15.0 N.
x: The peel strength is 15.0 N or more.
<Non-pressure-sensitive adhesion test peel strength>

An adherend and a film for a pressure-sensitive adhesive tape or pressure-sensitive adhesive tape including a non-pressure-sensitive adhesive layer were retained for 1 hour or more under storage at 23° C. with reference to JIS-Z-0237. After that, a non-pressure-sensitive adhesive surface was crimped onto SUS430BA at a linear pressure of 8 kg/m and a crimping rate of 0.3 m/min. 30 Minutes after that, a peel strength was measured at a pulling rate of 0.3 m/min by 180° peeling.
◎: Less than 0.5 N/20 mm
○: 0.5 N/20 mm or more and less than 1.0 N/20 mm
x: 1.0 N/20 mm or more
<Blocking test>

The pressure-sensitive adhesive layer surface of a pressure-sensitive adhesive tape was crimped onto the outermost surface (back surface layer) of the same pressure-sensitive adhesive tape opposite to its pressure-sensitive adhesive layer at a linear pressure of 8 Kg/m and a crimping rate of 0.3 m/min. After the crimping, the resultant was stored at 50° C. for 48 hours. After the storage, peeling was performed (in conformity with JIS-Z-0237) by a 180° peel test at a pulling rate of 0.3 m/min to measure the blocking (peel strength) of the pressure-sensitive adhesive layer surface and the back surface layer.

The evaluation was a comprehensive evaluation performed through the observation of, for example, the falling of the back surface layer at the time of the peeling and the failure of the pressure-sensitive adhesive layer (an adhesive residue due to a cohesive failure or an anchoring failure) together with the measurement of the peel strength.

The evaluation was performed in accordance with the following criteria.
○: The peel strength is less than 3.0 N/20 mm, and none of the falling and the failure of the pressure-sensitive adhesive layer is visually observed.
x: The peel strength is 3.0 N/20 mm or more, or the falling or the failure of the pressure-sensitive adhesive layer is visually observed.
<Anchoring property observation test>
(Anchoring Property Observation Test A)

A film for a pressure-sensitive adhesive tape or a pressure-sensitive adhesive tape was stretched by up to 200% at a pulling rate of 0.3 m/min to 3 m/min, and then the falling properties of the outermost surface (back surface layer) of the film for a pressure-sensitive adhesive tape or pressure-sensitive adhesive tape opposite to its pressure-sensitive adhesive layer at the time of the stretching and after the stretching were visually evaluated.
(Anchoring property observation test B)

After the same stretching as that of the anchoring property observation test A had been performed, a "NO. 31B" manufactured by Nitto Denko Corporation as a back surface treatment layer was crimped onto the back surface by reciprocating a 2-Kg roller (having a width of 25 mm) once at a crimping rate of 0.3 m/min. After that, the resultant was stored at 23° C. and 50% RH for 1 minute, and then 90° peeling was performed at a peel rate of 0.3 m/min to 3 m/min, followed by the visual evaluation of the back surface for its falling property.

(Evaluation)

The foregoing evaluations were comprehensively judged and then anchoring property was evaluated in accordance with the following criteria.
◎: The falling of the back surface that could be visually observed was absent in each of both the anchoring property observation test A and the anchoring property observation test B.
○: The falling of the back surface that could be visually observed was absent in the anchoring property observation test A and was slightly observed in the anchoring property observation test B (observed in a spot manner).
x: The falling of the back surface was observed in the anchoring property observation test A or the falling of the back surface was observed in the anchoring property observation test B.

Production Example 1

Production of Plastic Film

A soft polyvinyl chloride film containing 27 parts by weight of a DOP plasticizer (bis(2-ethylhexyl) phthalate, manufactured by J-PLUS Co., Ltd.) with respect to 100 parts by weight of a polyvinyl chloride having a polymerization degree P of 1,050 was produced by a calendering method. The soft polyvinyl chloride film had a thickness of 70 μm, a modulus of elasticity (MD) measured in accordance with JIS-K-7127 of 250 MPa, and a maximum elongation (MD) measured in accordance with JIS-K-7127 of 400%. In addition, the film had a surface roughness (arithmetic average surface roughness Ra) immediately after its production of 0.1 μm.

Example 1

60 Parts by weight of a silicone resin (KS-723A manufactured by Shin-Etsu Chemical Co., Ltd.), 40 parts by weight of a silicone resin (KS-723B manufactured by Shin-Etsu Chemical Co., Ltd.), 50 parts by weight of an acrylic copolymer (methyl methacrylate (MMA)/butyl acrylate (BA)/hydroxyethyl acrylate (HEA)=90/10/10), and 10 parts by weight of a tin-based catalyst (Cat-PS3 manufactured by Shin-Etsu Chemical Co., Ltd.) were mixed in a solution state to provide a mixed solution (1). A mixing ratio "silicone: (meth)acrylic polymer" between the silicone and (meth) acrylic polymer in the mixed solution (1) was 2:1 in terms of a weight ratio. In addition, the acrylic copolymer had a calculated Tg of 67.8° C. and an SP value of 10.7 $(cal/cm^3)^{0.5}$.

The mixed solution (1) was applied to one surface of the soft polyvinyl chloride film produced in Production Example 1 to form a non-pressure-sensitive adhesive layer having a thickness of 1.0 μm and an arithmetic average surface roughness Ra of 0.5 μm.

Thus, a film (1) for a pressure-sensitive adhesive tape was obtained.

Table 1 shows the results of the various evaluations.

Figure 1:
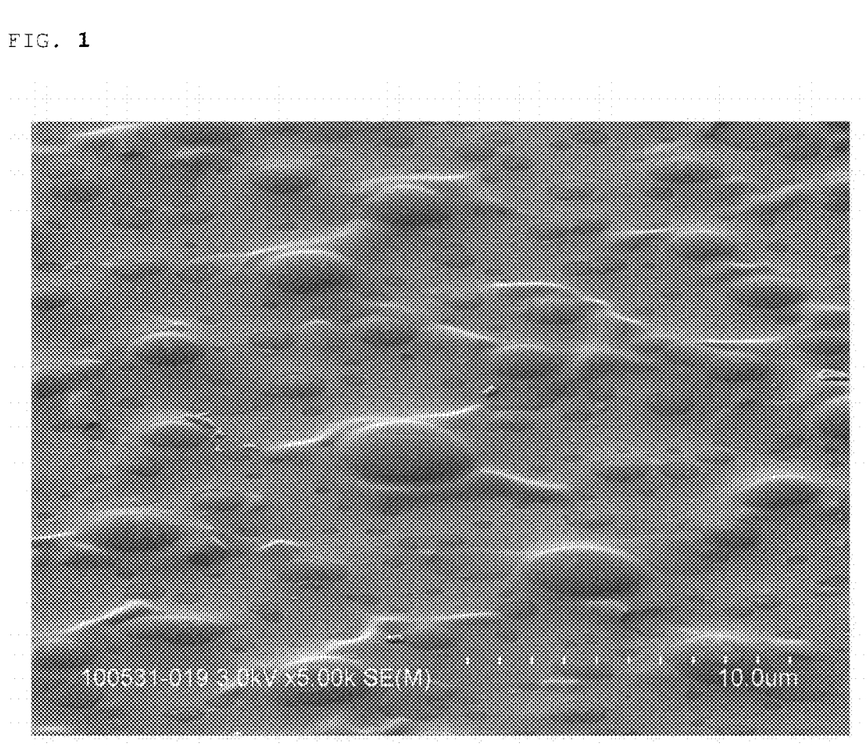
FIG. 1 is an SEM photographic image showing the state of the surface side of a non-pressure-sensitive adhesive layer in a film for a pressure-sensitive adhesive tape of the present invention.
Figure 2:
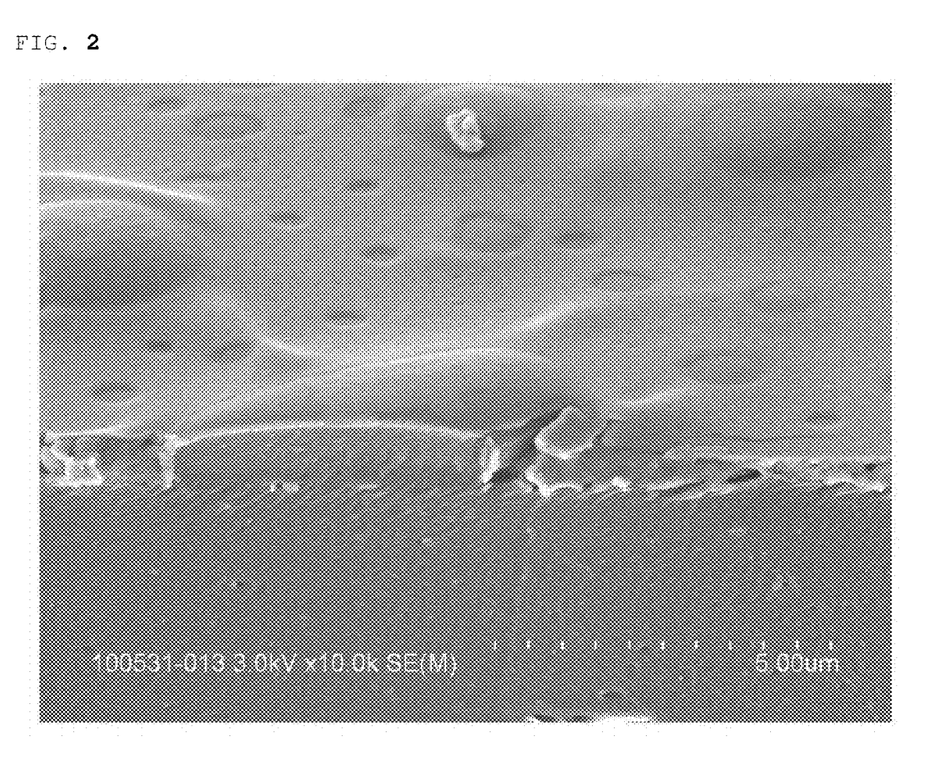
FIG. 2 is an SEM photographic image showing the state of the section side of the non-pressure-sensitive adhesive layer in the film for a pressure-sensitive adhesive tape of the present invention.
Figure 3:
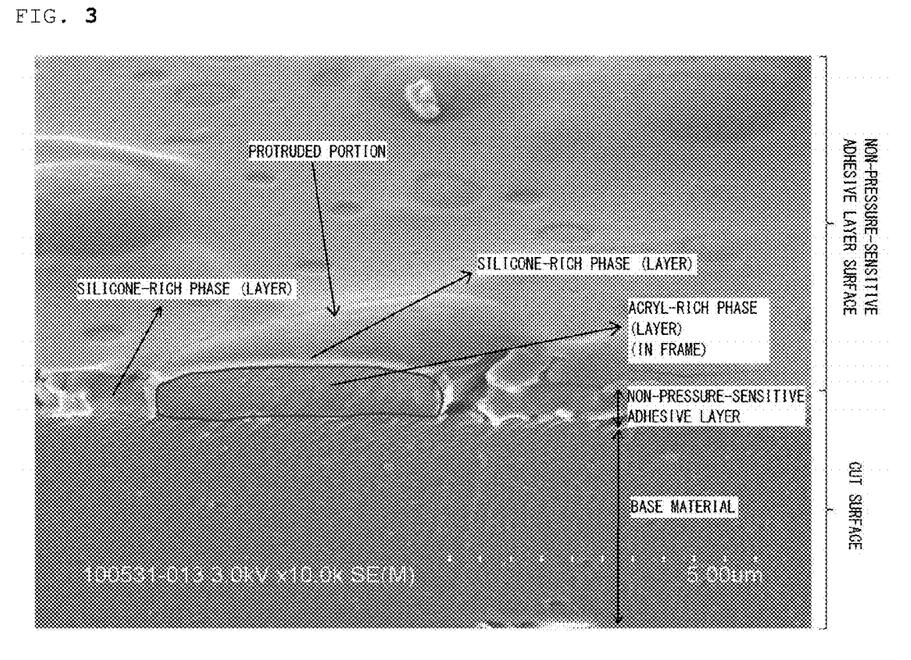
FIG. 3 is an SEM photographic image showing the state of the section side of the non-pressure-sensitive adhesive layer in the film for a pressure-sensitive adhesive tape of the present invention with description.

In addition, when the non-pressure-sensitive adhesive layer was observed with an SEM, as shown in FIG. 1, FIG. 2, and FIG. 3, it was able to be confirmed from the light and shade of a shape observation image that an air interface side and a plastic film side were different from each other in composition, and it was observed that the layer included a silicone-rich phase containing a larger amount of the silicone than that of the (meth)acrylic polymer and a (meth) acrylic polymer-rich phase containing a larger amount of the (meth)acrylic polymer than that of the silicone, a phase-separated structure in which the silicone-rich phase and the (meth)acrylic polymer-rich phase were independent of each other was formed, and the silicone-rich phase was present on the air interface side (side opposite to the plastic film) and the (meth)acrylic polymer-rich phase was present on the plastic film side.

Further, the non-pressure-sensitive adhesive layer was subjected to attenuated total reflection infrared spectroscopy (ATR-IR), and as a result of the measurement of the absorbance ratio of a peak around 800 cm$^{-1}$ derived from Si—CH$_3$ to a peak around 1725 cm$^{-1}$ derived from a carbonyl group in the (meth)acrylic polymer-rich phase, it was found that in the case where the Ge 45° prism was used, the peak around 800 cm$^{-1}$ enlarged as compared with that in the case where the ZnSe 45° prism was used. Therefore, it was found that the content of silicon increased on the air interface side as compared with that on a base material side.

FT-IR was also able to confirm that the silicone-rich phase was present on the air interface side (side opposite to the plastic film) in the non-pressure-sensitive adhesive layer. In the measurement by FT-IR, the air interface side was subjected to measurement by an ATR method with a "Spectrum One" manufactured by Perkinermer, and two kinds of prisms (ZnSe 45° and Ge 45°) having different analysis depth directions. As a result of the observation of the resultant chart, it was able to be confirmed that the absorbance ratio of the peak around 800 cm$^{-1}$ derived from Si—CH$_3$ to a peak in the range of 1720 cm$^{-1}$ to 1730 cm$^{-1}$ assigned to C=O derived from the (meth)acrylic polymer of the non-pressure-sensitive adhesive layer increased in the case where the Ge 45° prism having a shallow analysis depth direction was used. The foregoing was able to prove that the concentration of the silicone became higher on the air interface side.

In consideration of those observation results and the principle of the minimization of surface free energy, it was found that a bilayer structure having the silicone-rich phase on the air interface side was formed in the non-pressure-sensitive adhesive layer.

Example 2

A non-pressure-sensitive adhesive layer having a thickness of 0.7 μm and an arithmetic average surface roughness Ra of 1.0 μm was formed in the same manner as in Example 1 by, in Example 1, applying the mixed solution (1) to one surface of the soft polyvinyl chloride film produced in Production Example 1.

Thus, a film (2) for a pressure-sensitive adhesive tape was obtained.

Table 1 shows the results of the various evaluations.

Example 3

A toluene solution of a pressure-sensitive adhesive formed of 100 parts by weight of an acrylic copolymer constituted of butyl acrylate (BA), acrylonitrile (AN), and acrylic acid (AA) at a weight ratio of 85/15/2.5, 10 parts by weight of a melamine-based cross-linking agent (butanol-modified melamine-formaldehyde resin, "SUPER-BECK-AMINE J-820-60N" manufactured by Nippon Polyurethane Industry Co., Ltd.), and 60 parts by weight of a DOP plasticizer (bis(2-ethylhexyl) phthalate, manufactured by J-PLUS Co., Ltd.) was prepared.

The pressure-sensitive adhesive solution was applied to the surface of the film (1) for a pressure-sensitive adhesive tape obtained in Example 1 opposite to the non-pressure-sensitive adhesive layer. After that, the solution was dried at 130° C. for 90 seconds to form a pressure-sensitive adhesive layer having a thickness of 10 μm on the surface of the soft polyvinyl chloride film opposite to the non-pressure-sensitive adhesive layer. The formed pressure-sensitive adhesive layer had an SP value of 10.5.

Thus, a pressure-sensitive adhesive tape (3) was obtained.

Table 1 shows the results of the various evaluations.

Example 4

A film (4) for a pressure-sensitive adhesive tape was obtained in the same manner as in Example 1 except that 50 parts by weight of an acrylic copolymer formed of methyl methacrylate (MMA), ethyl acrylate (EA), and hydroxyethyl acrylate (HEA) at a ratio of 90/10/10 were used as an acrylic copolymer for forming a non-pressure-sensitive adhesive layer. A pressure-sensitive adhesive tape (4) was obtained in the same manner as in Example 3 except that the film (4) for a pressure-sensitive adhesive tape was used instead of the film (1) for a pressure-sensitive adhesive tape.

The acrylic copolymer had a calculated Tg of 74.3° C. and an SP value of 10.3 (cal/cm$^3$)$^{0.5}$.

The non-pressure-sensitive adhesive layer had a thickness of 1.0 μm and an arithmetic average surface roughness Ra of 0.5 μm.

Table 1 shows the results of the various evaluations.

Example 5

A film (5) for a pressure-sensitive adhesive tape was obtained in the same manner as in Example 1 except that 50 parts by weight of an acrylic copolymer formed of methyl methacrylate (MMA), cyclohexyl acrylate (CHA), and hydroxyethyl acrylate (HEA) at a ratio of 90/10/10 were used as an acrylic copolymer for forming a non-pressure-sensitive adhesive layer. A pressure-sensitive adhesive tape (5) was obtained in the same manner as in Example 3 except that the film (5) for a pressure-sensitive adhesive tape was used instead of the film (1) for a pressure-sensitive adhesive tape.

The acrylic copolymer had a calculated Tg of 80.0° C. and an SP value of 10.4 (cal/cm$^3$)$^{0.5}$.

The non-pressure-sensitive adhesive layer had a thickness of 1.0 μm and an arithmetic average surface roughness Ra of 0.5 μm.

Table 1 shows the results of the various evaluations.

Example 6

A film (6) for a pressure-sensitive adhesive tape was obtained in the same manner as in Example 1 except that 50 parts by weight of an acrylic copolymer formed of methyl methacrylate (MMA), butyl acrylate (BA), and hydroxyethyl acrylate (HEA) at a ratio of 95/5/15 were used as an acrylic copolymer for forming a non-pressure-sensitive adhesive layer. A pressure-sensitive adhesive tape (6) was obtained in the same manner as in Example 3 except that the film (6) for a pressure-sensitive adhesive tape was used instead of the film (1) for a pressure-sensitive adhesive tape.

The acrylic copolymer had a calculated Tg of 73.0° C. and an SP value of 10.5 (cal/cm$^3$)$^{0.5}$.

The non-pressure-sensitive adhesive layer had a thickness of 1.0 μm and an arithmetic average surface roughness Ra of 1.0 μm.

Table 1 shows the results of the various evaluations.

Example 7

A film (7) for a pressure-sensitive adhesive tape was obtained in the same manner as in Example 1 except that 50 parts by weight of an acrylic copolymer formed of methyl methacrylate (MMA), butyl acrylate (BA), and hydroxyethyl acrylate (HEA) at a ratio of 80/20/10 were used as an acrylic copolymer for forming a non-pressure-sensitive adhesive layer. A pressure-sensitive adhesive tape (7) was obtained in the same manner as in Example 3 except that the film (7) for a pressure-sensitive adhesive tape was used instead of the film (1) for a pressure-sensitive adhesive tape.

The acrylic copolymer had a calculated Tg of 48.5° C. and an SP value of 10.1 $(cal/cm^3)^{0.5}$.

The non-pressure-sensitive adhesive layer had a thickness of 1.0 μm and an arithmetic average surface roughness Ra of 0.2 μm.

Table 1 shows the results of the various evaluations.

Example 8

A film (8) for a pressure-sensitive adhesive tape was obtained in the same manner as in Example 1 except that 50 parts by weight of an acrylic copolymer formed of methyl methacrylate (MMA), butyl acrylate (BA), and hydroxyethyl acrylate (HEA) at a ratio of 99/1/5 were used as an acrylic copolymer for forming a non-pressure-sensitive adhesive layer. A pressure-sensitive adhesive tape (8) was obtained in the same manner as in Example 3 except that the film (8) for a pressure-sensitive adhesive tape was used instead of the film (1) for a pressure-sensitive adhesive tape.

The acrylic copolymer had a calculated Tg of 94.3° C. and an SP value of 10.1 $(cal/cm^3)^{0.5}$.

The non-pressure-sensitive adhesive layer had a thickness of 1.0 μm and an arithmetic average surface roughness Ra of 0.5 μm.

Table 1 shows the results of the various evaluations.

Example 9

A PET liner having a thickness of 38 μm subjected to an Si treatment was attached as a release liner to the pressure-sensitive adhesive layer side of the pressure-sensitive adhesive tape (5) obtained in Example 5 to provide a pressure-sensitive adhesive tape (9).

The non-pressure-sensitive adhesive layer had a thickness of 1.0 μm and an arithmetic average surface roughness Ra of 0.5 μm.

Table 1 shows the results of the various evaluations.

Example 10

A film (10) for a pressure-sensitive adhesive tape was obtained In the same manner as in Example 1 except that 50 parts by weight of an acrylic copolymer formed of methyl methacrylate (MMA), butyl acrylate (BA), and hydroxyethyl acrylate (HEA) at a ratio of 95/5/10 were used as an acrylic copolymer for forming a non-pressure-sensitive adhesive layer. A pressure-sensitive adhesive tape (10) was obtained in the same manner as in Example 3 except that the film (10) for a pressure-sensitive adhesive tape was used instead of the film (1) for a pressure-sensitive adhesive tape.

The acrylic copolymer had a calculated Tg of 77.2° C. and an SP value of 10.3 $(cal/cm^3)^{0.5}$.

The non-pressure-sensitive adhesive layer had a thickness of 1.0 μm and an arithmetic average surface roughness Ra of 0.7 μm.

Table 1 shows the results of the various evaluations.

Example 11

A film (11) for a pressure-sensitive adhesive tape was obtained in the same manner as in Example 1 except that 50 parts by weight of an acrylic copolymer formed of methyl methacrylate (MMA), butyl acrylate (BA), and hydroxyethyl acrylate (HEA) at a ratio of 70/30/10 were used as an acrylic copolymer for forming a non-pressure-sensitive adhesive layer. A pressure-sensitive adhesive tape (11) was obtained in the same manner as in Example 3 except that the film (11) for a pressure-sensitive adhesive tape was used instead of the film (1) for a pressure-sensitive adhesive tape.

The acrylic copolymer had a calculated Tg of 31.2° C. and an SP value of 10.4 $(cal/cm^3)^{0.5}$.

The non-pressure-sensitive adhesive layer had a thickness of 1.0 μm and an arithmetic average surface roughness Ra of 0.3 μm.

Table 1 shows the results of the various evaluations.

Comparative Example 1

A pressure-sensitive adhesive tape (C1) was obtained in the same manner as in Example 3 except that the non-pressure-sensitive adhesive layer was not formed in Example 3.

Table 1 shows the results of the various evaluations.

Comparative Example 2

A film (C2) for a pressure-sensitive adhesive tape was obtained in the same manner as in Example 1 except that 50 parts by weight of an acrylic copolymer formed of methyl methacrylate (MMA), butyl acrylate (BA), and hydroxyethyl acrylate (HEA) at a ratio of 55/45/10 were used as an acrylic copolymer for forming a non-pressure-sensitive adhesive layer. A pressure-sensitive adhesive tape (C2) was obtained in the same manner as in Example 3 except that the film (C2) for a pressure-sensitive adhesive tape was used instead of the film (1) for a pressure-sensitive adhesive tape.

The acrylic copolymer had a calculated Tg of 8.6° C. and an SP value of 10.4 $(cal/cm^3)^{0.5}$.

The non-pressure-sensitive adhesive layer had a thickness of 1.0 μm and an arithmetic average surface roughness Ra of 0.08 μm.

Table 1 shows the results of the various evaluations.

TABLE 1

| | Example 1 | Example 2 | Example 3 | Example 4 | Example 5 | Example 6 | Example 7 | Example 8 | Example 9 | Example 10 | Example 11 | Comparative Example 1 | Comparative Example 2 |
|---|---|---|---|---|---|---|---|---|---|---|---|---|---|
| MMA (part(s) by weight) | 90 | 90 | 90 | 90 | 90 | 95 | 80 | 99 | 90 | 95 | 70 | — | 55 |

TABLE 1-continued

| | Example 1 | Example 2 | Example 3 | Example 4 | Example 5 | Example 6 | Example 7 | Example 8 | Example 9 | Example 10 | Example 11 | Comparative Example 1 | Comparative Example 2 |
|---|---|---|---|---|---|---|---|---|---|---|---|---|---|
| BA (part(s) by weight) | 10 | 10 | 10 | — | — | 5 | 20 | 1 | — | 5 | 30 | — | 45 |
| EA (part(s) by weight) | — | — | — | 10 | — | — | — | — | — | — | — | — | — |
| CHA (part(s) by weight) | — | — | — | — | 10 | — | — | — | 10 | — | — | — | — |
| HEA (part(s) by weight) | 10 | 10 | 10 | 10 | 10 | 15 | 10 | 5 | 10 | 10 | 10 | — | 10 |
| Calculated Tg (° C.) | 67.8 | 67.8 | 67.8 | 74.3 | 80 | 73 | 48.5 | 94.3 | 80 | 77.2 | 31.2 | — | 8.6 |
| SP value ((cal/cm$^3$)$^{0.5}$) | 10.7 | 10.7 | 10.7 | 10.3 | 10.4 | 10.5 | 10.1 | 10.1 | 10.4 | 10.3 | 10.4 | — | 10.4 |
| Non-pressure-sensitive adhesion test peel strength | ◎ | ◎ | ◎ | ◎ | ◎ | ◎ | ◎ | ◎ | ◎ | ◎ | ◎ | ◎ | ◎ |
| Ra of non-pressure-sensitive adhesive layer (μm) | 0.5 | 0.1 | 0.5 | 0.5 | 0.5 | 1.0 | 0.2 | 0.5 | 0.5 | 0.7 | 0.3 | 0.1 | 0.08 |
| Thickness of non-pressure-sensitive adhesive layer (μm) | 1.0 | 0.7 | 1.0 | 1.0 | 1.0 | 1.0 | 1.0 | 1.0 | 1.0 | 1.0 | 1.0 | — | 1.0 |
| Silicone/(meth)acrylic polymer ratio (weight ratio) | 2:1 | 2:1 | 2:1 | 2:1 | 2:1 | 2:1 | 2:1 | 2:1 | 2:1 | 2:1 | 2:1 | — | 0.1 |
| Adsorption test (high temperature) | ○ | ○ | ○ | ○ | ○ | ○ | ○ | ○ | ○ | ○ | Δ | X | X |
| Anchoring property observation test | ◎ | ◎ | ◎ | ◎ | ◎ | ◎ | ◎ | ◎ | ◎ | ◎ | ◎ | — | ◎ |
| Blocking test | — | — | ○ | ○ | ○ | ○ | ○ | ○ | ○ | ○ | ○ | X | ◎ |

INDUSTRIAL APPLICABILITY

The pressure-sensitive adhesive tape of the present invention has the film for a pressure-sensitive adhesive tape of the present invention. Accordingly, as described above, in the case where dicing or the like is performed by performing adsorption fixation to a fixing base with a negative pressure, the occurrence of excessive close adhesion due to, for example, the heat generation of the base can be effectively suppressed. In addition, blocking in a roll shape is effectively suppressed, the tape does not tear or break upon its unwinding from the roll shape, conformity between the non-pressure-sensitive adhesive layer and the plastic film is good, and followability to a deformation such as stretching is good. Therefore, the tape can be suitably used in semiconductor processing in which a semiconductor wafer that is constituted of a brittle material, and can have a fine and intricate circuit pattern is used as an adherend. When the pressure-sensitive adhesive tape of the present invention is used in the semiconductor processing, in the case where the adsorption fixation is performed with a negative pressure, the occurrence of the excessive close adhesion can be suppressed and hence a semiconductor production process including the dicing can be smoothly progressed. In addition, when the pressure-sensitive adhesive tape of the present invention is used in the semiconductor processing, a film deformation or the accumulation of stress strain which has heretofore been occurring owing to the blocking does not occur, and hence the tape can be attached while accurately following the fine and intricate circuit pattern of the semiconductor wafer. In addition, natural release of the stress strain after the tape has been attached to the semiconductor wafer does not occur and hence the crush of the semiconductor wafer can be effectively prevented. In particular, a wafer to be used in an LED is constituted of an extremely brittle material such as gallium nitride, gallium arsenide, or silicon carbide. Accordingly, the pressure-sensitive adhesive tape of the present invention is extremely suitable for LED dicing or the like.

The invention claimed is:

1. A film for a pressure-sensitive adhesive tape, comprising a non-pressure-sensitive adhesive layer on one surface of a plastic film, wherein:
    the non-pressure-sensitive adhesive layer comprises a mixed layer of a silicone and a (meth)acrylic polymer;
    the (meth)acrylic polymer has a calculated Tg of 10° C. or more, and
    the non-pressure-sensitive adhesive layer has a phase-separated structure;
    the monomer components constituting the (meth)acrylic polymer contain a hydroxyl group-containing (meth)acrylic acid ester; and
    the content of the hydroxyl group-containing (meth)acrylic acid ester in the monomer components constituting the polymer is 2 wt % to 30 wt % with respect to the total amount of the monomer components except the hydroxyl group-containing (meth)acrylic acid ester,
    the non-pressure-sensitive adhesive layer has an arithmetic average surface roughness Ra of 0.1 μm or more, and
    the non-pressure-sensitive adhesive layer has a non-pressure-sensitive adhesion test peel strength of less than 1.0 N/20 mm,
    wherein the phase-separated structure includes a silicone-rich phase and a (meth)acrylic polymer-rich phase.

2. The film for a pressure-sensitive adhesive tape according to claim 1, wherein the (meth)acrylic polymer has a solubility parameter (SP) value of 9.0 (cal/cm$^3$)$^{0.5}$ to 12.0 (cal/cm$^3$)$^{0.5}$.

3. The film for a pressure-sensitive adhesive tape according to claim 1, wherein the mixing ratio "silicone:(meth)acrylic polymer" between the silicone and the (meth)acrylic polymer in the non-pressure-sensitive adhesive layer is 1:50 to 50:1 in terms of a weight ratio.

4. The film for a pressure-sensitive adhesive tape according to claim 1, wherein the non-pressure-sensitive adhesive layer has a thickness of 0.01 μm to 10 μm.

5. The film for a pressure-sensitive adhesive tape according to claim 1, wherein the plastic film has a maximum elongation measured in accordance with JIS-K-7127 of 100% or more.

6. The film for a pressure-sensitive adhesive tape according to claim 1, wherein the plastic film has a thickness of 20 μm to 200 μm.

7. The film for a pressure-sensitive adhesive tape according to claim 1, wherein the plastic film contains at least a polyvinyl chloride.

8. A pressure-sensitive adhesive tape, comprising a pressure-sensitive adhesive layer on a surface of the plastic film in the film for a pressure-sensitive adhesive tape according to claim 1 opposite to the non-pressure-sensitive adhesive layer.

9. The pressure-sensitive adhesive tape according to claim 8, wherein the pressure-sensitive adhesive layer contains at least one (meth)acrylic polymer.

10. The pressure-sensitive adhesive tape according to claim 8, wherein the pressure-sensitive adhesive layer has an SP value of 9.0 $(cal/cm^3)^{0.5}$ to 12.0 $(cal/cm^3)^{0.5}$.

11. The pressure-sensitive adhesive tape according to claim 8, further comprising a release liner on a surface of the pressure-sensitive adhesive layer.

12. The pressure-sensitive adhesive tape according to claim 8, wherein the pressure-sensitive adhesive tape is used in semiconductor processing.

13. The pressure-sensitive adhesive tape according to claim 8, wherein the pressure-sensitive adhesive tape is used in an LED dicing application.

* * * * *